(12) United States Patent
Yosui et al.

(10) Patent No.: US 9,972,567 B2
(45) Date of Patent: May 15, 2018

(54) MULTILAYER SUBSTRATE, COMPONENT MOUNTED BOARD, AND METHOD FOR PRODUCING COMPONENT MOUNTED BOARD

(71) Applicant: Murata Manufacturing Co., Ltd., Nagaokakyo-shi, Kyoto-fu (JP)

(72) Inventors: Kuniaki Yosui, Nagaokakyo (JP); Keisuke Ikeno, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days. days.

(21) Appl. No.: 15/616,996

(22) Filed: Jun. 8, 2017

(65) Prior Publication Data

US 2017/0271243 A1 Sep. 21, 2017

Related U.S. Application Data

(63) Continuation of application No. PCT/JP2016/072605, filed on Aug. 2, 2016.

(30) Foreign Application Priority Data

Aug. 10, 2015 (JP) .................................. 2015-158174
Sep. 25, 2015 (JP) .................................. 2015-187889

(51) Int. Cl.
*H01L 23/498* (2006.01)
*H01L 23/00* (2006.01)
*H01L 21/48* (2006.01)

(52) U.S. Cl.
CPC ...... *H01L 23/4985* (2013.01); *H01L 21/4853* (2013.01); *H01L 21/4857* (2013.01);
(Continued)

(58) Field of Classification Search
CPC ........... H01L 21/4857; H01L 23/49822; H01L 23/12; H01L 23/4985; H01L 21/4853; H01L 23/49811; H01L 24/17; H01L 24/81
See application file for complete search history.

(56) References Cited

U.S. PATENT DOCUMENTS

2004/0212087 A1 10/2004 Murayama et al.
2007/0114673 A1 5/2007 Murayama et al.
(Continued)

FOREIGN PATENT DOCUMENTS

JP 10-294397 A 11/1998
JP 2000-68328 A 3/2000
(Continued)

OTHER PUBLICATIONS

Official Communication issued in International Patent Application No. PCT/JP2016/072605, dated Oct. 18, 2016.

*Primary Examiner* — Walter H Swanson
(74) *Attorney, Agent, or Firm* — Keating & Bennett, LLP

(57) ABSTRACT

A multilayer substrate includes a flexible element assembly including a principal surface, a first to an n-th external electrode disposed on the principal surface, and at least one first dummy conductor disposed inside the element assembly in a floating state. When the element assembly is viewed from a normal direction of the principal surface, a distance between an m-th external electrode and a nearest external electrode therefrom among the first to the n-th external electrodes is defined as a distance Dm, an average of distances D1 to Dn is defined as an average Dave, and an area within a circle having a center on the m-th external electrode and having a radius of Dm is defined as an area Am. The first dummy conductor is located in at least one
(Continued)

area Am having a radius of Dm greater than the average Dave when viewed from the normal direction.

19 Claims, 16 Drawing Sheets

(52) U.S. Cl.
CPC .. *H01L 23/49811* (2013.01); *H01L 23/49822* (2013.01); *H01L 23/49827* (2013.01); *H01L 23/49838* (2013.01); *H01L 23/562* (2013.01); *H01L 24/17* (2013.01); *H01L 24/81* (2013.01); *H01L 2224/13144* (2013.01); *H01L 2224/16227* (2013.01); *H01L 2224/17132* (2013.01); *H01L 2224/81191* (2013.01); *H01L 2224/81205* (2013.01); *H01L 2924/14* (2013.01); *H01L 2924/35* (2013.01)

(56) References Cited

U.S. PATENT DOCUMENTS

| | | | |
|---|---|---|---|
| 2014/0339695 A1 | 11/2014 | Yamauchi et al. | |
| 2016/0111378 A1* | 4/2016 | Chen | H01L 23/562 |
| | | | 257/773 |
| 2017/0250141 A1* | 8/2017 | Imayoshi | H01L 23/562 |

FOREIGN PATENT DOCUMENTS

| | | |
|---|---|---|
| JP | 2004-327721 A | 11/2004 |
| JP | 2006-120683 A | 5/2006 |
| JP | 2014-241388 A | 12/2014 |
| WO | WO 2016075863 * | 5/2016 |

* cited by examiner

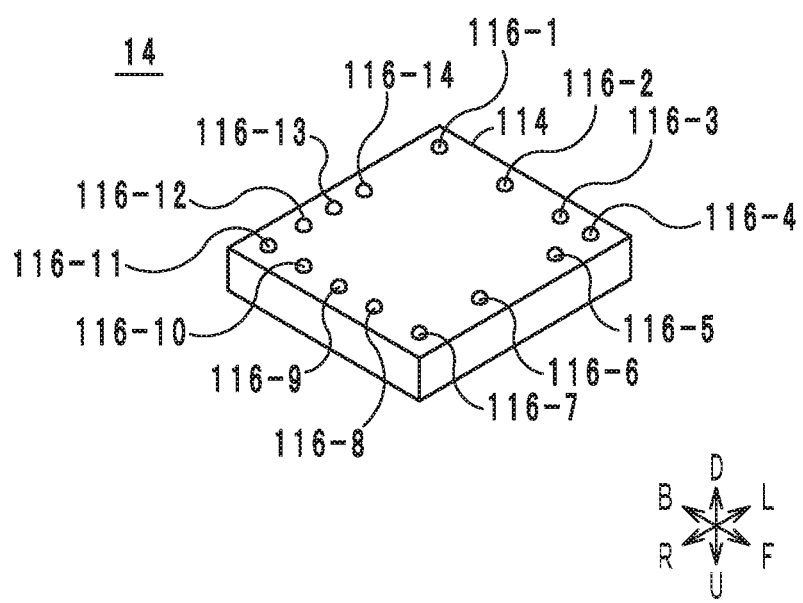

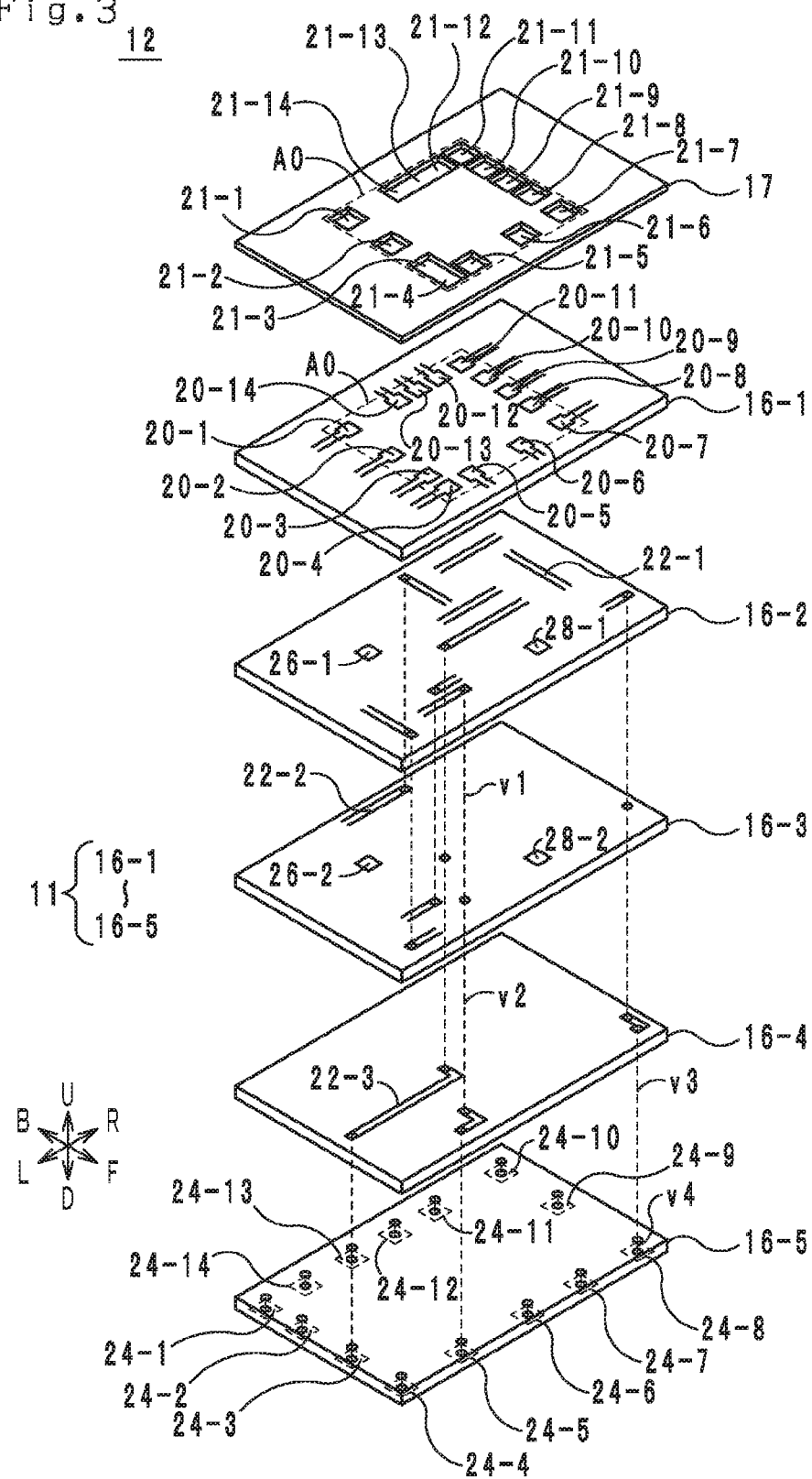

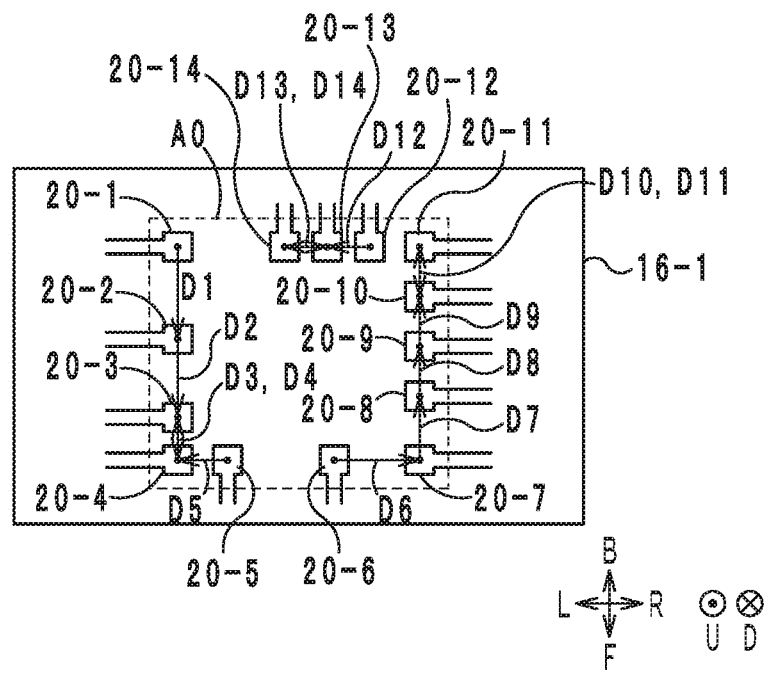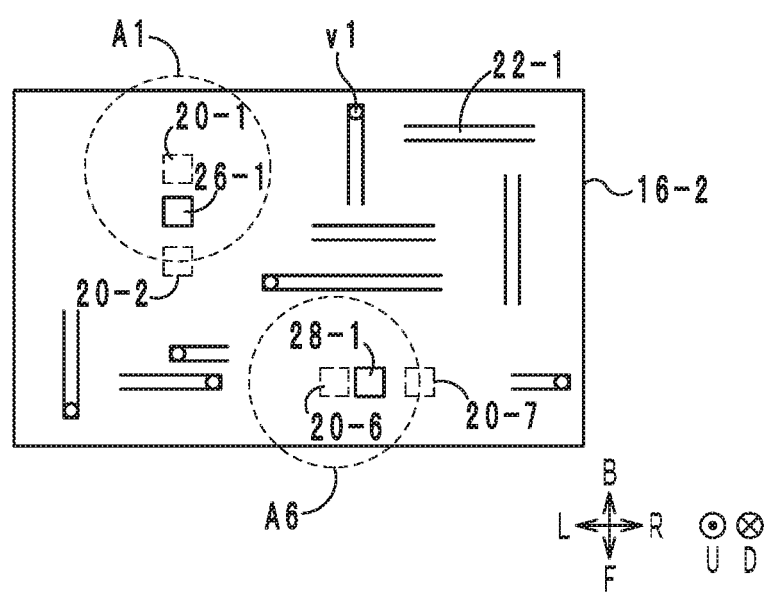

Fig. 20
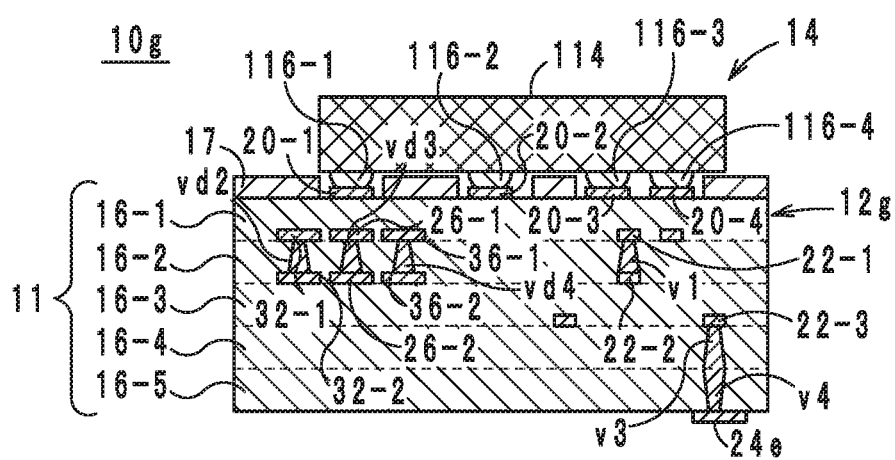
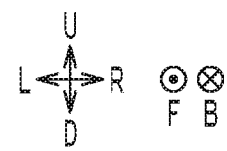

МULTILAYER SUBSTRATE, COMPONENT MOUNTED BOARD, AND METHOD FOR PRODUCING COMPONENT MOUNTED BOARD

CROSS REFERENCE TO RELATED APPLICATIONS

This application claims the benefit of priority to Japanese Patent Application No. 2015-158174 filed on Aug. 10, 2015 and Japanese Patent Application No. 2015-187889 filed on Sep. 25, 2015 and is a Continuation Application of PCT Application No. PCT/JP2016/072605 filed on Aug. 2, 2016. The entire contents of each application are hereby incorporated herein by reference.

BACKGROUND OF THE INVENTION

1. Field of the Invention

The present invention relates to a multilayer substrate, a component mounted board, and a method for producing a component mounted board.

2. Description of the Related Art

Among past inventions relating to multilayer substrates, for example, a semiconductor mounting method disclosed in Japanese Patent Application Publication No. 2006-120683 is known. In the semiconductor mounting method, bumps of a bare semiconductor chip are bonded to wires of a flexible wiring board, which includes films of liquid crystal polymer, by ultrasonic flip-chip bonding. By applying ultrasonic vibration to the semiconductor chip in a direction substantially the same as the alignment direction of the liquid crystal polymer, the wires and the bumps are bonded together.

However, since the flexible wiring board is flexible and likely to deform, it is difficult to mount the bare semiconductor chip to the flexible wiring board securely by the semiconductor mounting method disclosed in Japanese Patent Application Publication No. 2006-120683. More specifically, the bare semiconductor chip may include a dense-bump region where bumps are distributed densely and a sparse-bump region where bumps are distributed sparsely. In this case, the flexible wiring board includes a dense-wire region where wires which the bumps are to be bonded to are distributed densely and a sparse-wire region where the wires are distributed sparsely.

In this case, the deformability of the flexible wiring board differs between the wire-dense region and the wire-sparse region. When ultrasonic vibration is applied to the semiconductor chip, the semiconductor chip is pressed against the flexible wiring board, and the amount of deformation differs between in the wire-dense region and in the wire-sparse region. Accordingly, the condition of bonding of the wires to the bumps differs between in the wire-dense region and in the wire-sparse region. Thus, it is difficult to mount the bare semiconductor chip to the flexible wiring board securely.

SUMMARY OF THE INVENTION

Preferred embodiments of the present invention provide a multilayer substrate which a component is able to be mounted to more securely, a component mounted board, and a method for producing a component mounted board.

A multilayer substrate according to a preferred embodiment of the present invention includes a flexible element assembly including a principal surface; a first to an n-th external electrode disposed on the principal surface and capable of mounting a component, where n is an integer not less than 3; and at least one first dummy conductor disposed inside the element assembly in a floating state, wherein when the element assembly is viewed from a normal direction that is normal to the principal surface, a distance between an m-th external electrode and a nearest external electrode therefrom among the first to the n-th external electrodes is defined as a distance Dm, where m is an integer not less than 1 and not more than n; an average of distances D1 to Dn is defined as an average Dave; when the element assembly is viewed from the normal direction, an area within a circle having a center on the m-th external electrode and having a radius of Dm is defined as an area Am; and the first dummy conductor is located in at least one area Am having a radius of Dm greater than the average Dave when viewed from the normal direction.

A component mounted board according to a preferred embodiment of the present invention includes the above-described multilayer substrate; and a component including first to an n-th bumps and mounted on the principal surface of the multilayer substrate, where n is an integer not less than 3, wherein the first to the n-th external electrodes are bonded to the first to the n-th bumps, respectively, by ultrasonic boding.

A production method of a component mounted board according to a preferred embodiment of the present invention is a method for producing a component mounted board including a multilayer substrate including a flexible element assembly including a principal surface; a first to an n-th external electrode disposed on the principal surface and capable of mounting a component, where n is an integer not less than 3; and at least one first dummy conductor disposed inside the element assembly in a floating state, wherein when the element assembly is viewed from a normal direction of the principal surface, a distance between an m-th external electrode and a nearest external electrode therefrom among the first to the n-th external electrodes is defined as a distance Dm, where m is an integer not less than 1 and not more than n; an average of distances D1 to Dn is defined as an average Dave; when the element assembly is viewed from the normal direction, an area within a circle having a center on the m-th external electrode and having a radius of Dm is defined as an area Am; and the first dummy conductor is located in at least one area Am having radius of Dm greater than the average Dave when viewed from the normal direction; and a component including a first to an n-th bump, wherein n is an integer not less than 3, the method comprising: forming the multilayer substrate including the first to the n-th external electrodes and the first dummy conductor; and bonding the first to the n-th external electrodes to the first to the n-th bumps, respectively, by ultrasonic bonding.

Preferred embodiments of the present invention allow to achieve more secure mounting a component.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a perspective view of a mounted component 14.

FIG. 3 is an exploded perspective view of a multilayer substrate 12.

FIG. 4 is a top view of an insulating sheet 16-1.

FIG. 5 is a top view of an insulating sheet 16-2.

FIG. 20 is a sectional view of a component mounted board 10g according to a seventh modification of a preferred embodiment of the present invention.

DETAILED DESCRIPTION OF THE PREFERRED EMBODIMENTS

Figure 1:
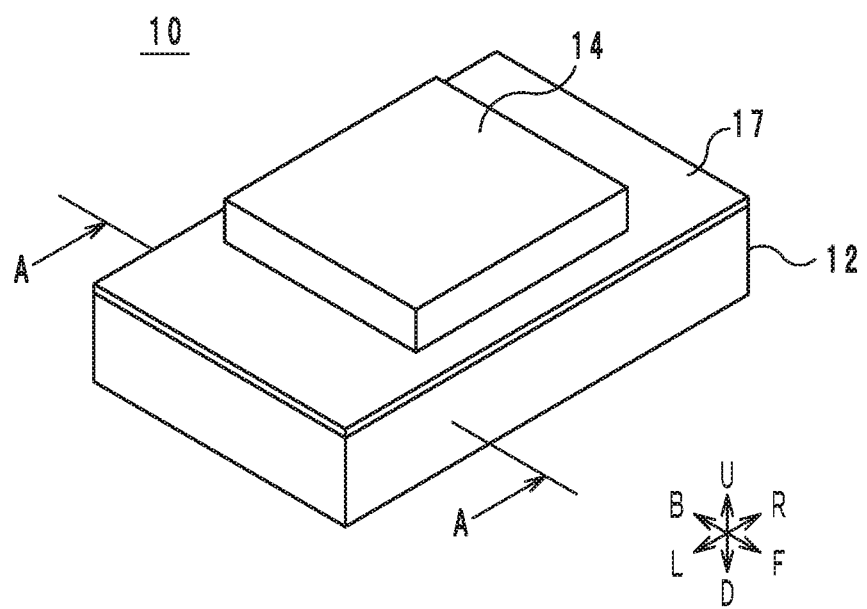
FIG. 1 is a perspective view of a component mounted board 10 according to a preferred embodiment of the present invention.
Figure 6:
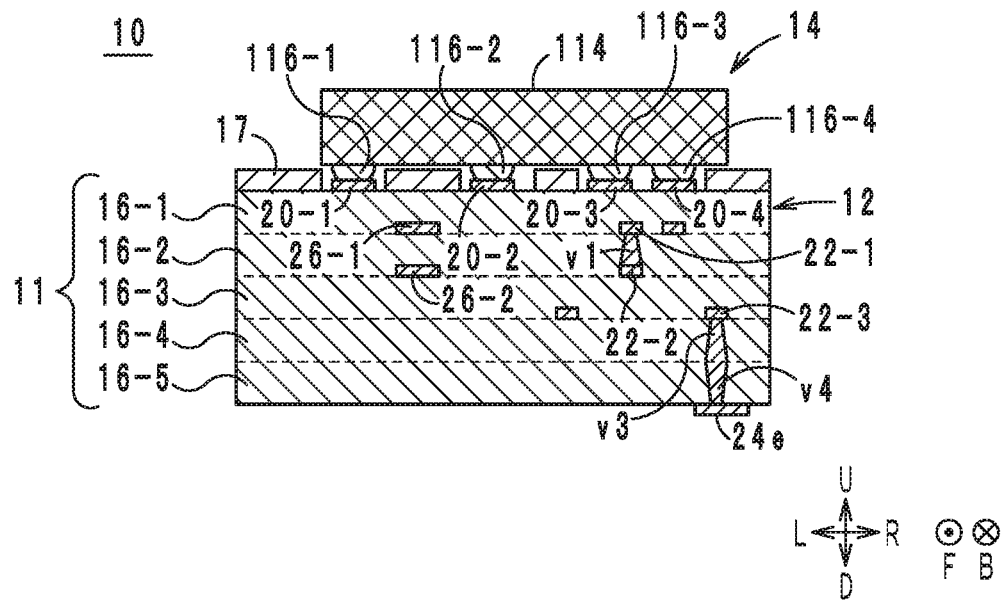
FIG. 6 is a sectional view along the line A-A in FIG. 1.

With reference to the drawings, the structures of a multilayer substrate and a component mounted board according to a first preferred embodiment of the present invention will hereinafter be described. FIG. 1 is a perspective view of the component mounted board 10 according to the present preferred embodiment of the present invention. FIG. 2 is a perspective view of a mounted component 14. FIG. 3 is a perspective view of a multilayer substrate 12. FIG. 4 is a top view of an insulating sheet 16-1. FIG. 5 is a top view of an insulating sheet 16-2. FIG. 6 is a sectional view along the line A-A in FIG. 1. In the following, the layer stacking direction of the multilayer substrate 12 is defined as an up-down direction (an example of a normal direction that is normal to a principal surface of an element assembly). The lengthwise direction of the multilayer substrate 12 when the multilayer substrate 12 is viewed from above is defined as a right-left direction, and the widthwise direction of the multilayer substrate 12 when the multilayer substrate 12 is viewed from above is defined as a front-back direction. The up-down direction, the right-left direction and the front-back direction are perpendicular to one another.

The component mounted board 10 is, for example, a module that incorporates a semiconductor integrated circuit that is to be mounted in a cell phone or any other electronic device. As shown in FIG. 1, the component mounted board 10 includes a multilayer substrate 12 and a component 14 mounted thereon.

The component 14 is, for example, a semiconductor integrated circuit such as RFIC, CCD or any other image pick-up element. As shown in FIG. 2, the component 14 includes a body 114 and bumps 116-1 to 116-14. The body 114 preferably is in the shape of a rectangular or substantially rectangular plate when viewed from above. The upper principal surface of the body 114 will be hereinafter referred to as a top surface, and the lower principal surface of the body 114 will be hereinafter referred to as a bottom surface.

The bumps 116-1 to 116-14 (examples of a first to an n-th bump) are disposed on the bottom surface of the body 114, and serve as external terminals for connection to the multilayer substrate 12. The bumps 116-1 to 116-14 are made of gold or other metal, for example. Before the component 14 is mounted to the substrate 12, each of the bumps 116-1 to 116-14 is spherical or hemispherical. The bumps 116-1 to 116-14 are arranged along the outer edge of the bottom surface of the body 114. Specifically, the bumps 116-1 to 116-4 are aligned in this order from back to front along the left side of the bottom surface of the body 114. The bumps 116-4 to 116-7 are aligned in this order from left to right along the front side of the bottom surface of the body 114. The bumps 116-7 to 116-11 are aligned in this order from front to back along the right side of the bottom surface of the body 114. The bumps 116-11 to 116-14 are aligned in this order from right to left along the back side of the bottom surface of the body 114. The bumps 116-1 to 116-14 are arranged at irregular intervals in the right-left direction and in the front-back direction. Accordingly, there are dense-bump regions where the bumps 116-1 to 116-14 are densely distributed and sparse-bump regions where the bumps 116-1 to 116-14 are sparsely distributed.

The multilayer substrate 12 is a flexible substrate which the component 14 is to be mounted to. As shown in FIG. 3, the multilayer substrate 12 includes an element assembly 11, a protective layer 17, external electrodes 20-1 to 20-14 and 24-1 to 24-14, wiring thin conductors 22-1 to 22-3, dummy thin conductors 26-1, 26-2, 28-1 and 28-2, and via-hole conductors v1 to v4. The multilayer substrate 12 includes other wiring thin conductors in addition to the wiring thin conductors 22-1 to 22-3, but in FIG. 3, the wiring thin conductors other than the wiring thin conductors 22-1 to 22-3 are not shown. The multilayer substrate 12 includes other via-hole conductors in addition to the via-hole conductors v1 to v4, but in FIG. 3, the via-hole conductors other than the via-hole conductors v1 to v4 are not shown. In FIG. 3, only representative wiring thin conductors and representative via-hole conductors are marked with reference symbols.

As shown in FIG. 3, the element assembly 11 is a flexible plate that preferably is rectangular or substantially rectangular when viewed from above. The long sides of the element assembly 11 are parallel or substantially parallel to the right-left direction. A shown in FIG. 3, the element assembly 11 is a multilayered body including insulating sheets 16-1 to 16-5 stacked in this order from top to bottom. The upper principal surface of the element assembly 11 will hereinafter be referred to as a top surface, and the lower principal surface of the element assembly 11 will hereinafter be referred to as a bottom surface.

As shown in FIG. 3, each of the insulating sheets 16-1 to 16-5 preferably is rectangular or substantially rectangular and has the same or substantially the same shape as the element assembly 11 when viewed from above. The lengthwise direction of the insulating sheets 16-1 to 16-5 is parallel or substantially parallel to the right-left direction. The insulating sheets 16-1 to 16-5 are insulating layers made of flexible thermoplastic resin such as polyimide, liquid crystal polymer or the like. The upper principal surface of each of the insulating sheets 16-1 to 16-5 will hereinafter be referred to as an upper surface, and the lower principal surface of each other insulating sheets 16-1 to 16-5 will hereinafter be referred to as a lower surface.

The external electrodes 20-1 to 20-14 (examples of a first to an n-th external electrode) are rectangular or substantially rectangular thin conductors, and are located on the upper surface of the insulating sheet 16-1 to correspond to the bumps 116-1 to 116-14 respectively. The arrangement of the external electrodes 20-1 to 20-14 is described in detail below.

When the multilayer substrate 12 is viewed from above, the area to overlap the component 14 is referred to as an area A0. The external electrodes 20-1 to 20-14 are located within the area A0 and are arranged along the outer edge of the area A0. Specifically, the external electrodes 20-1 to 20-4 are aligned in this order from back to front along the left side of the area A0. The external electrodes 20-4 to 20-7 are aligned in this order from left to right along the front side of the area A0. The external electrodes 20-7 to 20-11 are aligned in this order from front to back along the right side of the area A0. The external electrodes 20-11 to 20-14 are aligned in this order from right to left along the back side of the area A0.

The external electrodes 20-1 to 20-14 are arranged at irregular intervals in the right-left direction and in the front-back direction. Accordingly, there are dense-external-electrode regions where the external electrodes 20-1 to 20-14 are densely distributed and sparse-external-electrode regions where the external electrodes 20-1 to 20-14 are sparsely distributed. Accordingly, when the multilayer substrate 12 is viewed from above, the distance from each of the external electrodes 20-1 to 20-14 to the nearest external electrode varies. Distances D1 to D14 are defined as follows (see FIG. 4).

Distance D1: When viewed from above, the distance between the external electrode 20-1 and the external electrode that is the nearest from the external electrode 20-1 among the external electrodes 20-1 to 20-14 (that is, the external electrode 20-2) is defined as a distance D1.

Distance D2: When viewed from above, the distance between the external electrode 20-2 and the external electrode that is the nearest from the external electrode 20-2 among the external electrodes 20-1 to 20-14 (that is, the external electrode 20-3) is defined as a distance D2.

Distance D3: When viewed from above, the distance between the external electrode 20-3 and the external electrode that is the nearest from the external electrode 20-3 among the external electrodes 20-1 to 20-14 (that is, the external electrode 20-4) is defined as a distance D3.

Distance D4: When viewed from above, the distance between the external electrode 20-4 and the external electrode that is the nearest from the external electrode 20-4 among the external electrodes 20-1 to 20-14 (that is, the external electrode 20-3) is defined as a distance D4.

Distance D5: When viewed from above, the distance between the external electrode 20-5 and the external electrode that is the nearest from the external electrode 20-5 among the external electrodes 20-1 to 20-14 (that is, the external electrode 20-4) is defined as a distance D5.

Distance D6: When viewed from above, the distance between the external electrode 20-6 and the external electrode that is the nearest from the external electrode 20-6 among the external electrodes 20-1 to 20-14 (that is, the external electrode 20-7) is defined as a distance D6.

Distance D7: When viewed from above, the distance between the external electrode 20-7 and the external electrode that is the nearest from the external electrode 20-7 among the external electrodes 20-1 to 20-14 (that is, the external electrode 20-8) is defined as a distance D7.

Distance D8: When viewed from above, the distance between the external electrode 20-8 and the external electrode that is the nearest from the external electrode 20-8 among the external electrodes 20-1 to 20-14 (that is, the external electrode 20-9) is defined as a distance D8.

Distance D9: When viewed from above, the distance between the external electrode 20-9 and the external electrode that is the nearest from the external electrode 20-9 among the external electrodes 20-1 to 20-14 (that is, the external electrode 20-10) is defined as a distance D9.

Distance D10: When viewed from above, the distance between the external electrode 20-10 and the external electrode that is the nearest from the external electrode 20-10 among the external electrodes 20-1 to 20-14 (that is, the external electrode 20-11) is defined as a distance D10.

Distance D11: When viewed from above, the distance between the external electrode 20-11 and the external electrode that is the nearest from the external electrode 20-11 among the external electrodes 20-1 to 20-14 (that is, the external electrode 20-10) is defined as a distance D11.

Distance D12: When viewed from above, the distance between the external electrode 20-12 and the external electrode that is the nearest from the external electrode 20-12 among the external electrodes 20-1 to 20-14 (that is, the external electrode 20-13) is defined as a distance D12.

Distance D13: When viewed from above, the distance between the external electrode 20-13 and the external electrode that is the nearest from the external electrode 20-13 among the external electrodes 20-1 to 20-14 (that is, the external electrode 20-14) is defined as a distance D13.

Distance D14: When viewed from above, the distance between the external electrode 20-14 and the external electrode that is the nearest from the external electrode 20-14 among the external electrodes 20-1 to 20-14 (that is, the external electrode 20-13) is defined as a distance D14.

The average of the distances D1 to D14 is defined as an average Dave. In this case, the following formula (1) holds between the distances D1 to D14 and the average Dave.

$$D1 > D2 = D6 > D7 > Dave > D5 = D8 = D9 = D10 = D11 > D3 = D4 = D12 = D13 = D14$$

The external electrodes 20-1 to 20-14 arranged in this manner are used to mount the component 14. Specifically, the external electrodes 20-1 to 20-14 are bonded to the bumps 116-1 to 116-14, respectively, by ultrasonic welding (also referred to as ultrasonic bonding). During the ultrasonic welding, the bottom edges of the bumps 116-1 to 116-14 are crushed slightly as shown in FIG. 6. Accordingly, the bumps 116-1 to 116-14 are not in point contact but in surface contact with the external electrodes 20-1 to 20-14, respectively.

The protective layer 17 is a resin layer covering almost the entire upper surface of the insulating sheet 16-1. However, the protective layer 17 has rectangular or substantially rectangular openings 21-1 to 21-14, and there are regions not covered by the protective layer 17. The external electrodes 20-1 to 20-14 are exposed to the outside of the multilayer substrate 12 through the openings 21-1 to 21-14, respectively.

The external electrodes 24-1 to 24-14 preferably are rectangular or substantially rectangular when viewed from above. The external electrodes 24-1 to 24-14 are used to mount the multilayer substrate 12 to a printed wiring board or any other circuit board (not shown), and at least one of the external electrodes 24-1 to 24-14 is to be electrically connected to the circuit board. The external electrodes 24-1 to 24-14 are arranged along the outer edge of the lower surface of the insulating sheet 16-5. Specifically, the external electrodes 24-1 to 24-4 are aligned in this order from back to front along the left side of the lower surface of the insulating sheet 16-5. The external electrodes 24-4 to 24-8 are aligned in this order from left to right along the front side of the lower surface of the insulating sheet 16-5. The external electrodes 24-8 to 24-10 are aligned in this order from front to back along the right side of the lower surface of the insulating sheet 16-5. The external electrodes 24-10 to 24-14 are aligned in this order from right to left along the back side of the lower surface of the insulating sheet 16-5.

The wiring thin conductors 22-1 to 22-3 (examples of second thin conductors) are linear thin conductors disposed on the insulating sheets 16-2 to 16-4, respectively. Thus, the wiring thin conductors 22-1 to 22-3 are located inside the element assembly 11. The via-hole conductors v1 to v4 pierce through the insulating sheets 16-2 to 16-5 in the up-down direction, respectively. The via-hole conductor v1 connects the wiring thin conductor 22-1 and the wiring thin conductor 22-2. The via-hole conductor v2 connects the wiring thin conductor 22-2 and the wiring thin conductor 22-3. The via-hole conductors v3 and v4 connect the wiring thin conductor 22-3 and the external electrodes 24-1 to 24-14. Other via-hole conductors and other wiring thin conductors are disposed in/on the insulating sheet 16-1, but the via-hole conductors and the wiring thin conductors are not shown in FIG. 3. The external electrodes 20-1 to 20-14 are electrically connected to the external electrodes 24-1 to 24-14 through the wiring thin conductors 22-1 to 22-3, the via-hole conductors v1 to v4, and the wiring thin conductors and the via-hole conductors that are not shown in the drawings.

For more secure mounting of the component 14 to the multilayer substrate 12, the multilayer substrate 12 includes dummy thin conductors 26-1, 26-2, 28-1 and 28-2 (examples of a first dummy conductor and examples of first thin conductors). The dummy thin conductors 26-1, 26-2, 28-1 and 28-2 are described in detail below.

As shown in FIG. 5, when viewed from above, the areas within circles having centers on the median points of the respective external electrodes 20-1 to 20-14 (examples of an m-th external electrode) and having radii of the respective distances D1 to D14 (examples of a distance Dm) are defined as areas A1 to A14 (examples of an area Am), respectively. In FIG. 5, only the areas A1 and A6 are shown.

The dummy thin conductors 26-1 and 28-1 are rectangular or substantially rectangular thin conductors disposed on the upper surface of the insulating sheet 16-2 (that is, disposed inside the element assembly 11). The dummy thin conductors 26-1 and 28-1 are not connected to any other conductors, and therefore are in a floating state. The floating state means a state not to be connected to the electric potential of the electric source or any other electric potential. When viewed above, the dummy thin conductors 26-1 and 28-1 are located within the areas A1 and A6, respectively. The areas A1 and A6 are among the areas A1, A2, A6 and A7 that have radii of D1, D2, D6 and D7, respectively, which are greater than the average Dave.

No external electrodes are near the external electrodes 20-1, 20-2, 20-6 and 20-7, which correspond to the areas A1, A2, A6 and A7, respectively, and the areas A1, A2, A6 and A7 are sparse-external-electrode regions where the external electrodes are sparsely distributed. In at least one of the areas A1, A2, A6 and A7 where the external electrodes are sparsely distributed (in this case, in the areas A1 and A6), the dummy thin conductors 26-1 and 28-1 are located. The area A1 where the dummy thin conductor 26-1 is located is an area with the greatest radius of D1. The area A6 where the dummy thin conductor 26-2 is located is an area with the second greatest radius of D6.

The dummy thin conductors 26-2 and 28-2 are rectangular or substantially rectangular thin conductors disposed on the upper surface of the insulating sheet 16-3 (that is, disposed inside the element assembly 11). The dummy thin conductors 26-2 and 28-2 are not connected to any other conductors, and therefore are in a floating state. The dummy thin conductor 26-2 has the same shape as the dummy thin conductor 26-1 and completely overlaps the dummy thin conductor 26-1 when viewed from above. The dummy thin conductor 28-2 has the same shape as the dummy thin conductor 28-1 and completely overlaps the dummy thin conductor 28-1 when viewed from above. The dummy thin conductors 26-1 and 26-2 may be connected to each other by a via-hole conductor piercing through the insulating sheet 16-2. The dummy thin conductors 28-1 and 28-2 may be connected to each other by a via-hole conductor piercing through the insulating sheet 16-2.

A non-limiting example of a production method of the component mounted board 10 will hereinafter be described with reference to the drawings. FIGS. 7 to 10 are sectional views of the component mounted board 10 during a production process thereof. In the following, a case of producing one multilayer substrate 12 will be described as an example. Practically, however, large-sized insulating sheets are stacked, and the stack of insulating sheets is cut, such that a plurality of multilayer substrates 12 are produced at one time.

First, insulating sheets 16-1 to 16-5 made of liquid polymer are prepared. Next, a sheet of copper foil is applied entirely on one surface of each of the insulating sheets 16-1 to 16-5. Specifically, sheets of copper foil are applied onto the upper surfaces of the insulating sheets 16-1 to 16-4, respectively. A sheet of copper foil is applied onto the lower surface of the insulating sheet 16-5. The sheets of copper foil on the insulating sheets 16-1 to 16-5 are galvanized for corrosion proof and are smoothened. Any metal foil other than copper foil may be used.

Next, the copper foil on the upper surface of the insulating sheet 16-1 is patterned, such that the external electrodes 20-1 to 20-14 and the wiring thin conductor (not shown) are formed on the upper surface of the insulating sheet 16-1. Specifically, resists having the same shapes as the external electrodes 20-1 to 20-14 shown in FIG. 3 and a resist having the same shape as the wiring thin conductor (not shown) are printed on the copper foil on the upper surface of the insulating sheet 16-1. Next, the copper foil is etched, such that the copper foil is removed from the portions that are not covered by the resists. Thereafter, the upper surface of the insulating sheet 16-1 is sprayed with a wash solution (resist remover), such that the resists are removed. Thus, as shown in FIG. 3, the external electrodes 20-1 to 20-14 and the wiring thin conductor (not shown) are formed on the upper surface of the insulating sheet 16-1 by photolithography, for example.

Next, the wiring thin conductors 22-1 to 22-3 and the dummy thin conductors 26-1, 26-2, 28-1 and 28-2 are formed on the upper surfaces of the insulating sheets 16-2 to 16-4 as shown in FIG. 3. Also, the external electrodes 24-1 to 24-14 are formed on the lower surface of the insulating sheet 16-5 as shown in FIG. 3. The processes of forming the wiring thin conductors 22-1 to 22-3, the external electrodes 24-1 to 24-14 and the dummy thin conductors 26-1, 26-2, 28-1 and 28-2 are the same as the process of forming the external electrodes 20-1 to 20-14 and the wiring thin conductor (not shown), and descriptions of the processes are omitted.

Next, the points of the insulating sheets 16-1 to 16-5 where the via-hole conductors v1 to v4 and the other via-hole conductors that are not shown in the drawings are to be formed are irradiated with a laser beam, such that through holes are made. The through holes are filled with conductive paste mainly including copper, silver or any other metal.

Figure 7:
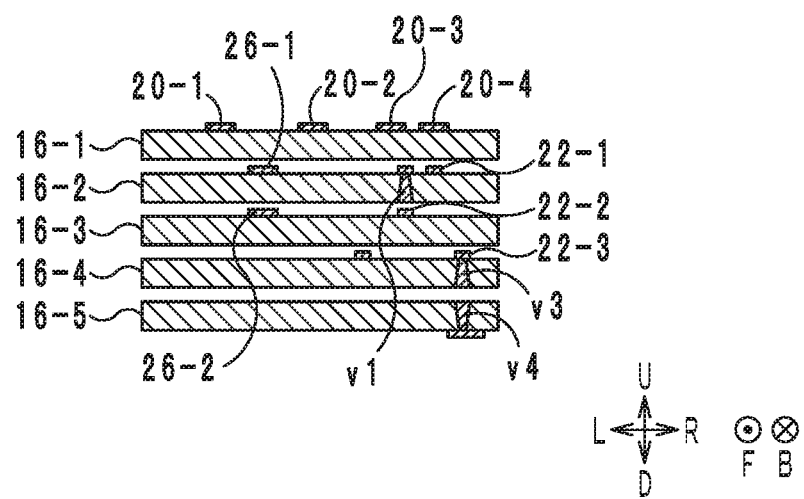
FIG. 7 is a sectional view of the component mounted board 10 during a production process.
Figure 8:
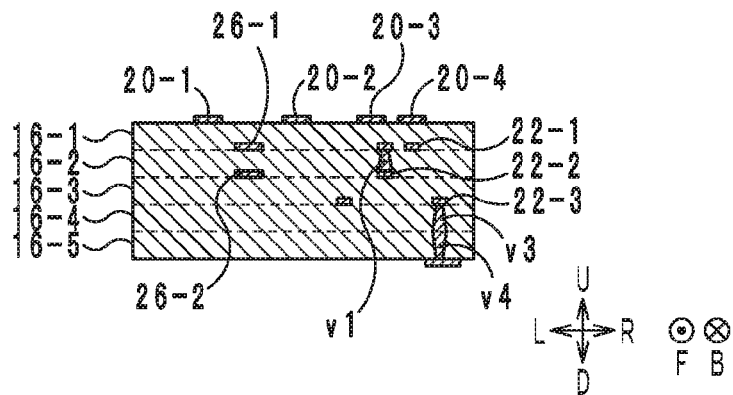
FIG. 8 is a sectional view of the component mounted board 10 during the production process.

Next, thermal-compression bonding is performed to form the multilayer substrate 12. Specifically, as shown in FIG. 7, the insulating sheets 16-1 to 16-5 are stacked upon one another, and a pressing treatment and a heating treatment (that is, thermal-compression bonding) are applied to the insulating sheets 16-1 to 16-5. The pressing treatment is performed by pressing the insulating sheets 16-1 to 16-5 from above and below. The application of a pressing treatment and a heating treatment to the insulating sheets 16-1 to 16-5 leads to softening of the insulating sheets 16-1 to 16-5 and hardening of the conductive paste in the through holes. As a result, the insulating sheets 16-1 to 16-5 are bonded together, and the via-hole conductors v1 to v4 are formed. Through the process above, the element assembly 11 is formed as shown in FIG. 8.

Figure 9:
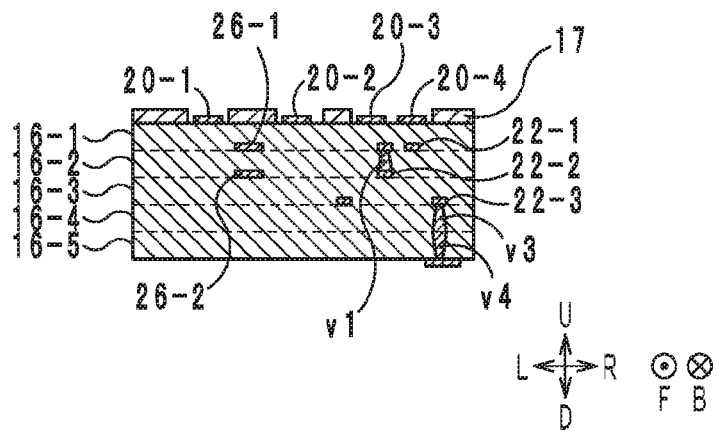
FIG. 9 is a sectional view of the component mounted board 10 during the production process.

Next, resin (resist) paste is applied onto the upper surface of the insulating sheet 16-1 by screen printing, such that the protective layer 17 is formed on the upper surface of the insulating sheet 16-1 as shown in FIG. 9. Through the process above, the multilayer substrate 12 is produced.

Figure 10:
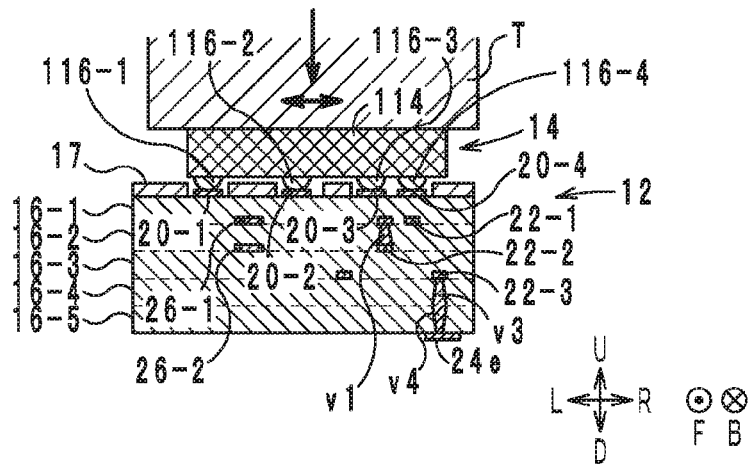
FIG. 10 is a sectional view of the component mounted board 10 during the production process.

Next, the component 14 is mounted to the multilayer substrate 12 as shown in FIG. 10. Specifically, the component 14 is placed on the multilayer substrate 12 such that the bumps 116-1 to 116-14 come into contact with the external electrodes 20-1 to 20-14, respectively. Thereafter, an ultrasonic bonding machine T is pressed against the top surface of the component 14, and the ultrasonic bonding machine T is driven. Thus, ultrasonic vibration is transmitted to the bumps 116-1 to 116-14 and the external electrodes 20-1 to 20-14 via the body 114. Then, the external electrodes 20-1 to 20-14 are metallurgically joined to the bumps 116-1 to 116-14, respectively, by the ultrasonic vibration. Through the process above, the component mounted board 10 is produced.

In the component mounted board 10 and the multilayer substrate 12, the component 14 is mounted to the multilayer substrate 12 more securely. More specifically, in the multilayer substrate 12, the areas A1, A2, A6 and A7 have radii of D1, D2, D6 and D7, respectively, which are greater than the average Dave. No other external electrodes are near the external electrode 20-1, 20-2, 20-6 or 20-7, which correspond to the areas A1, A2, A6 and A7, respectively, and therefore, the areas A1, A2, A6 and A7 are sparse-external-electrode regions where the external electrodes are sparsely distributed. On the other hand, the areas A3 to A5 and A8 to A14 are dense-external-electrode regions where the external electrodes are densely distributed. Therefore, the deformability of the multilayer substrate 12 differs between in the areas A1, A2, A6 and A7 and in the areas A3 to A5 and A8 to A14.

In the multilayer substrate 12, therefore, the dummy thin conductors 26-1, 26-2, 28-1 and 28-2 are located in the areas A1 and A6, which are among the areas A1, A2, A6 and A7, when the multilayer substrate 12 is viewed from above. Thus, the deformability of the multilayer substrate 12 in the areas A1 and A6 becomes closer to the deformability of the multilayer substrate 12 in the areas A3 to A5 and A8 to A14. Accordingly, the amount of deformation of the multilayer substrate 12 in the areas A1 and A6 during the mounting of the component 14 to the multilayer substrate 12 becomes closer to the amount of deformation of the multilayer substrate in the areas A3 to A5 and A8 to A14 during the mounting. Consequently, the condition of bonding of the respective external electrodes 20-1 and 20-6 to the respective bumps 116-1 and 116-6 becomes closer to the condition of bonding of the respective external electrodes 20-3 to 20-5 and 20-8 to 20-14 to the respective bumps 116-3 to 116-5 and 116-8 to 116-14. Hence, the component mounted board 10 and the multilayer substrate 12 allow the component 14 to be mounted to the multilayer substrate 12 more securely.

In the component mounted board 10 and the multilayer substrate 12, the component 14 is able to be mounted to the multilayer substrate 12 more securely also for the following reason. The area A1 is an area having the greatest radius of D1. Therefore, during the mounting of the component 14 to the multilayer substrate 12, the difference between the amount of deformation of the multilayer substrate 12 in the area A1 and the amount of deformation of the multilayer substrate 12 in the areas A3 to A5 and A8 to A14 is the greatest of the differences between the amounts of deformation of the multilayer substrate 12 in the respective areas A1, A2, A6 and A7 and the amount of deformation of the multilayer substrate 12 in the areas A3 to A5 and A8 to A14. Therefore, in the multilayer substrate 12, the dummy thin conductors 26-1 and 26-2 are located in the area A1 when viewed above. Thus, the greatest difference in the amount of deformation of the multilayer substrate 12 becomes smaller, which leads to securer mounting of the component 14 to the multilayer substrate 12.

In the component mounted board 10 and the multilayer substrate 12, the dummy thin conductors 26-2 and 28-2 are additionally provided to overlap the dummy thin conductors 26-1 and 28-1, respectively, when viewed from above. By increasing or decreasing the number of dummy thin conductors overlapping each other in the up-down direction, it is possible to adjust the deformability of the multilayer substrate 12 in the areas A1 and A6. In this way, it is possible to adjust the deformability of the multilayer substrate 12 in each of the areas A1 to A14.

In the component mounted board 10 and the multilayer substrate 12, the dummy thin conductors 26-1, 26-2, 28-1 and 28-2 are disposed on the insulating sheets 16-2 and 16-3, which are different from the insulating sheet 16-1 where the external electrodes 20-1 to 20-14 are disposed. This prevents short circuits between the dummy thin conductors 26-1, 26-2, 28-1 and 28-2 and the external electrodes 20-1 to 20-14.

Figure 11:
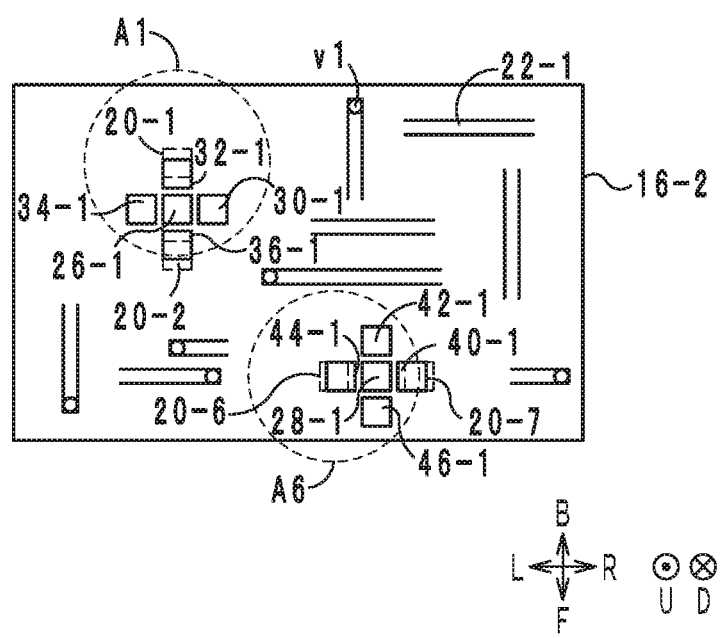
FIG. 11 is a top view of an insulating sheet 16-2 of a multilayer substrate 12a according to a first modification of a preferred embodiment of the present invention.
Figure 12:
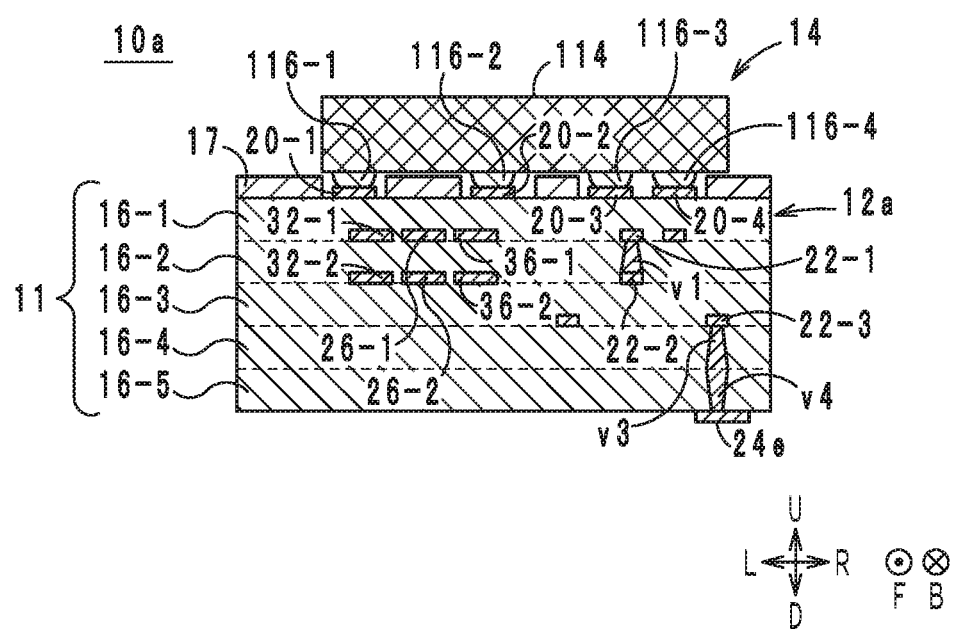
FIG. 12 is a sectional view of a component mounted board 10a according to the first modification of a preferred embodiment of the present invention.

Next, a multilayer substrate and a component mounted board according to a first modification of a preferred embodiment of the present invention will be described with reference to the drawings. FIG. 11 is a top view of the insulating sheet 16-2 of the multilayer substrate 12a according to the first modification. FIG. 12 is a sectional view of the component mounted board 10a according to the first modification.

As shown in FIGS. 11 and 12, the multilayer substrate 12a differs from the multilayer substrate 12 in that the multilayer substrate 12a further includes dummy thin conductors 30-1, 32-1, 34-1, 36-1, 30-2, 32-2, 34-2, 36-2, 40-1, 42-1, 44-1, 46-1, 40-2, 42-2, 44-2 and 46-2 (examples of a second dummy conductor) though the dummy thin conductors 30-2, 34-2, 40-2, 42-2, 44-2 and 46-2 are not shown in FIGS. 11 and 12. In the following, the multilayer substrate 12a and the component mounted board 10a will be described with a focus on the difference from the multilayer substrate 12 and the component mounted board 10.

The dummy thin conductors 30-1, 32-1, 34-1 and 36-1 are disposed on the upper surface of the insulating sheet 16-2 where the dummy thin conductor 26-1 is disposed, and are arranged to surround the dummy thin conductor 26-1. Specifically, the dummy thin conductor 30-1 is located on the right side of the dummy thin conductor 26-1. The dummy thin conductor 32-1 is located on the back side of the dummy thin conductor 26-1. The dummy thin conductor 34-1 is located on the left side of the dummy thin conductor 26-1. The dummy thin conductor 36-1 is located on the front side of the dummy thin conductor 26-1. When viewed from above, the dummy thin conductors 30-1, 32-1, 34-1 and 36-1 are located within the area A1.

The dummy thin conductors 30-2, 32-2, 34-2 and 36-2 are disposed on the upper surface of the insulating sheet 16-3 where the dummy thin conductor 26-2 is disposed, and are arranged to surround the dummy thin conductor 26-2. Specifically, the dummy thin conductor 30-2 is located on the right side of the dummy thin conductor 26-2. The dummy thin conductor 32-2 is located on the back side of the dummy thin conductor 26-2. The dummy thin conductor 34-2 is located on the left side of the dummy thin conductor 26-2. The dummy thin conductor 36-2 is located on the front side of the dummy thin conductor 26-2. When viewed from above, the dummy thin conductors 30-2, 32-2, 34-2 and 36-2 are located within the area A1.

The dummy thin conductors 40-1, 42-1, 44-1 and 46-1 are disposed on the upper surface of the insulating sheet 16-2 where the dummy thin conductor 28-1 is disposed, and are arranged to surround the dummy thin conductor 28-1. Specifically, the dummy thin conductor 40-1 is located on the right side of the dummy thin conductor 28-1. The dummy thin conductor 42-1 is located on the back side of the dummy thin conductor 28-1. The dummy thin conductor 44-1 is located on the left side of the dummy thin conductor 28-1. The dummy thin conductor 46-1 is located on the front side of the dummy thin conductor 28-1. When viewed from above, the centers of the respective dummy thin conductors 40-1, 42-1, 44-1 and 46-1 are located within the area A6.

The dummy thin conductors 40-2, 42-2, 44-2 and 46-2 are disposed on the upper surface of the insulating sheet 16-3 where the dummy thin conductor 28-2 is disposed, and are arranged to surround the dummy thin conductor 28-2. Specifically, the dummy thin conductor 40-2 is located on the right side of the dummy thin conductor 28-2. The dummy thin conductor 42-2 is located on the back side of the dummy thin conductor 28-2. The dummy thin conductor 44-2 is located on the left side of the dummy thin conductor 28-2. The dummy thin conductor 46-2 is located on the front side of the dummy thin conductor 28-2. When viewed from above, the centers of the respective dummy thin conductors 40-2, 42-2, 44-2 and 46-2 are located within the area A6.

The multilayer substrate 12a and the component mounted board 10a configured as described above have the same advantageous effects as the multilayer substrate 12 and the component mounted board 10.

In the multilayer substrate 12a and the component mounted board 10a, the dummy thin conductors 30-1, 32-1, 34-1 and 36-1 are disposed around the dummy thin conductor 26-1. This prevents the dummy thin conductor 26-1 from being displaced in the front-back direction and in the right-left direction. For the same reason, the dummy thin conductors 26-2, 28-1 and 28-2 are prevented from being displaced in the front-back direction and in the right-left direction. Accordingly, the dummy thin conductors 26-1, 26-2, 28-1 and 28-2 function effectively, and it is possible to mount the component 14 to the multilayer substrate 12 more securely.

Figure 13:
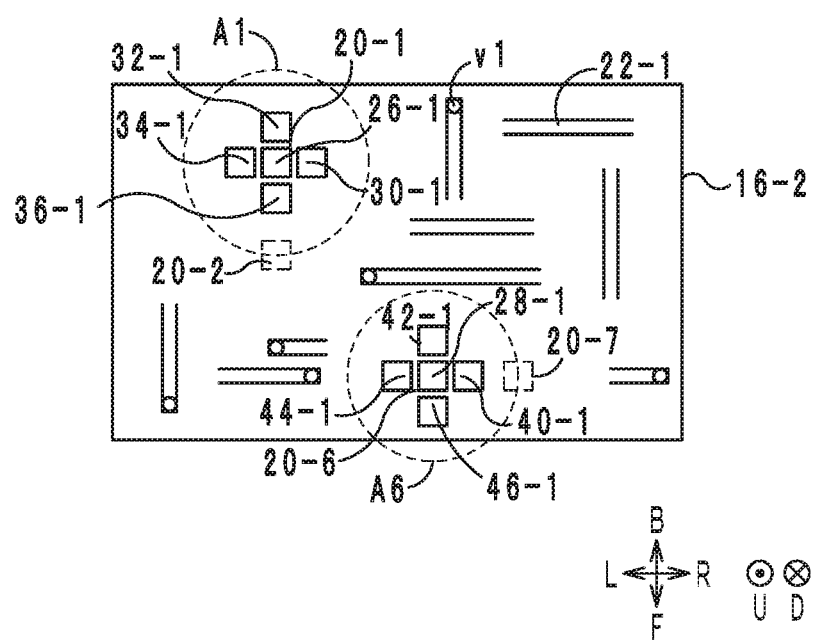
FIG. 13 is a top view of an insulating sheet 16-2 of a multilayer substrate 12b according to a second modification of a preferred embodiment of the present invention.
Figure 14:
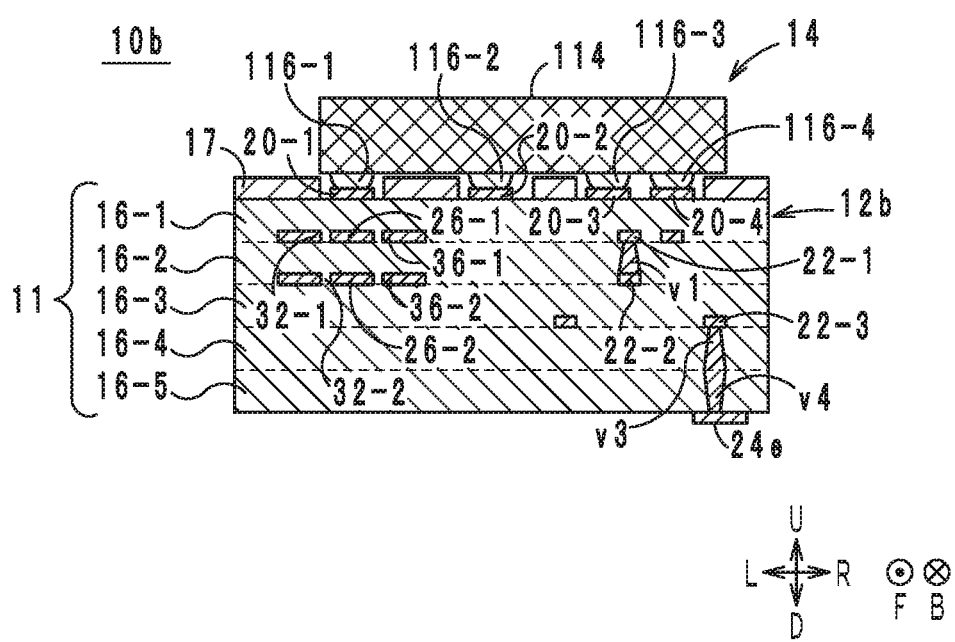
FIG. 14 is a sectional view of a component mounted board 10b according to the second modification of a preferred embodiment of the present invention.

Next, a multilayer substrate and a component mounted board according to a second modification of a preferred embodiment of the present invention will be described with reference to the drawings. FIG. 13 is a top view of the insulating sheet 16-2 of the multilayer substrate 12b according to the second modification. FIG. 14 is a sectional view of the component mounted board 10b according to the second modification.

As shown in FIG. 13, the multilayer substrate 12b differs from the multilayer substrate 12a in the locations of the dummy thin conductors 26-1, 26-2, 28-1, 28-2, 30-1, 32-1, 34-1, 36-1, 30-2, 32-2, 34-2, 36-2, 40-1, 42-1, 44-1, 46-1, 40-2, 42-2, 44-2 and 46-2. More specifically, in the multilayer substrate 12b, the dummy thin conductors 26-1 and 26-2 overlap the external electrode 20-1 when viewed from above. The dummy thin conductors 28-1 and 28-2 overlap the external electrode 20-6 when viewed above. The locations of the dummy thin conductors 30-1, 32-1, 34-1, 36-1, 30-2, 32-2, 34-2, 36-2, 40-1, 42-1, 44-1, 46-1, 40-2, 42-2, 44-2 and 46-2 relative to the dummy thin conductors 26-1, 26-2, 28-1 and 28-2 in the multilayer substrate 12b are the same as those in the multilayer substrate 12a, and descriptions thereof are omitted.

The multilayer substrate 12b and the component mounted board 10b configured as described above have the same advantageous effects as the multilayer substrate 12b and the component mounted board 10b.

The dummy thin conductors 26-1 and 26-2 are located just under the external electrode 20-1. Accordingly, the dummy thin conductors 26-1 and 26-2 effectively prevent the external electrode 20-1 from sinking by pressure applied thereto at the time of mounting of the component 14. For the same reason, the external electrode 20-6 is prevented from sinking. Hence, it is possible to mount the component 14 to the multilayer substrate 12b more securely.

In the multilayer substrate 12b, also, the dummy thin conductor 26-1 is located just under the external electrode 20-1. Accordingly, at the time of mounting of the component 14, the dummy thin conductor 26-1 is pressed downward strongly by the external electrode 20-1. This may cause displacement of the dummy thin conductor 26-1 in the front-back direction and in the right-left direction.

In the multilayer substrate 12b and the component mounted board 10b, therefore, the dummy thin conductors 30-1, 32-1, 34-1 and 36-1 are located around the dummy thin conductor 26-1. Accordingly, at the time of compression bonding to form the multilayer substrate 12a and in other occasions, the dummy thin conductors 30-1, 32-1, 34-1 and 36-1 prevent the dummy thin conductor 26-1 from being displaced in the front-back direction and in the right-left direction. Thus, in the multilayer substrate 12b where the dummy thin conductor 26-1 is located just under the external electrode 20-1, it is preferred that the dummy thin conductors 30-1, 32-1, 34-1 and 36-1 are provided. For the same reason, the dummy thin conductors 26-2, 28-1 and 28-2 are prevented from being displaced in the front-back direction and in the right-left direction.

Figure 15:
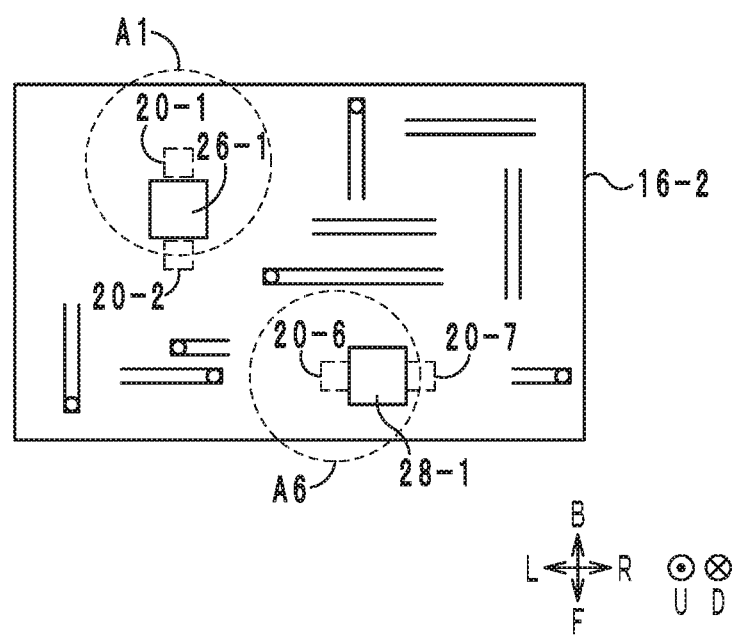
FIG. 15 is a top view of an insulating sheet 16-2 of a multilayer substrate 12c according to a third modification of a preferred embodiment of the present invention.

Next, a multilayer substrate and a component mounted board according to a third modification of a preferred embodiment of the present invention will be described with reference to the drawings. FIG. 15 is a top view of the insulating sheet 16-2 of the multilayer substrate 12c according to the third modification. FIG. 14 is a sectional view of the component mounted board 10c according to the third modification.

Figure 16:
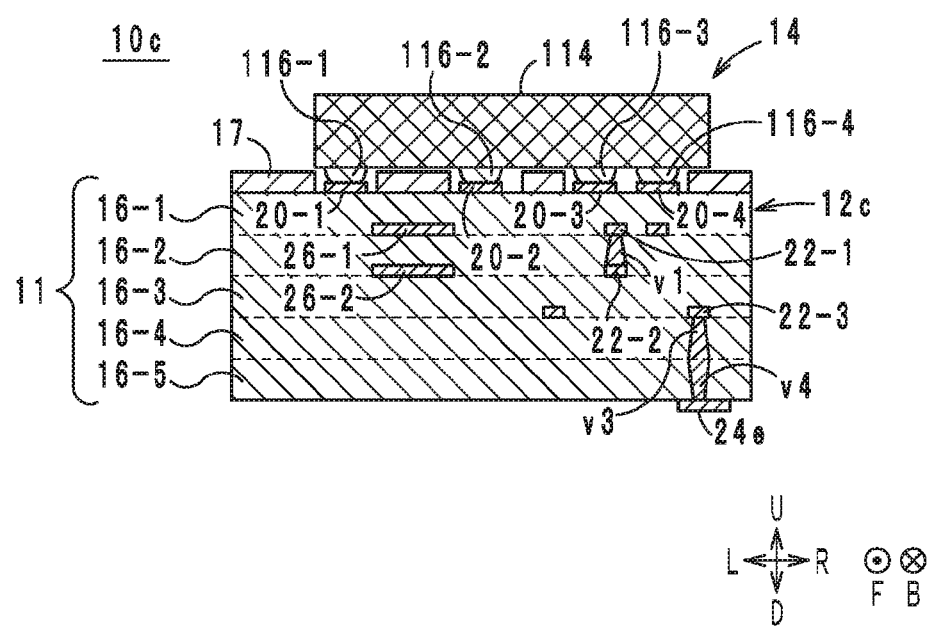
FIG. 16 is a sectional view of a component mounted board 10c according to the third modification of a preferred embodiment of the present invention.

As shown in FIGS. 15 and 16, the multilayer substrate 12c differs from the multilayer substrate 12 in the size of the dummy thin conductors 26-1, 26-2, 28-1 and 28-2. The dummy thin conductors 26-1, 26-2, 28-1 and 28-2 of the multilayer substrate 12c are larger than those of the multilayer substrate 12. The deformability of the areas A1 and A6 of the multilayer substrate 12 may be adjusted by adjustment of the size of the dummy thin conductors 26-1, 26-2, 28-1 and 28-2.

Figure 17:
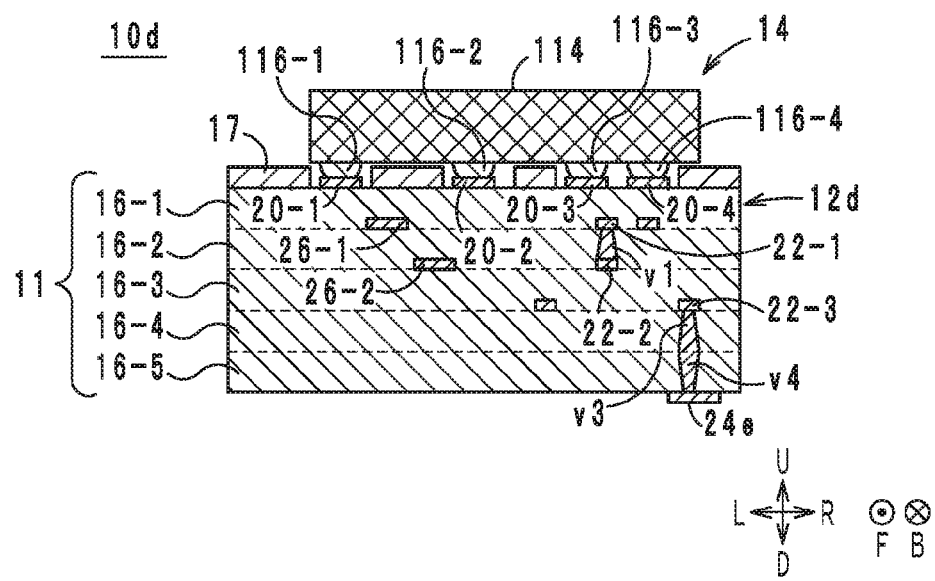
FIG. 17 is a sectional view of a component mounted board 10d according to a fourth modification of a preferred embodiment of the present invention.

Next, a multilayer substrate according a fourth modification of a preferred embodiment of the present invention will be described with reference to the drawings. FIG. 17 is a sectional view of a component mounted board 10d according to the fourth modification.

The multilayer substrate 12d according to the fourth modification differs from the multilayer substrate 12 in the location of the dummy thin conductor 26-2. In the multilayer substrate 12d, the dummy thin conductor 26-2 (an example of the second dummy conductor) does not overlap the dummy thin conductor 26-1 (an example of the first dummy conductor) when viewed from above, and the dummy thin conductor 26-2 is disposed on the insulating sheet 16-2 that is different from the insulating sheet 16-1 where the dummy thin conductor 26-1 is disposed. The dummy thin conductor 26-1 and the dummy thin conductor 26-2 do not need to overlap each other when viewed from above.

Figure 18:
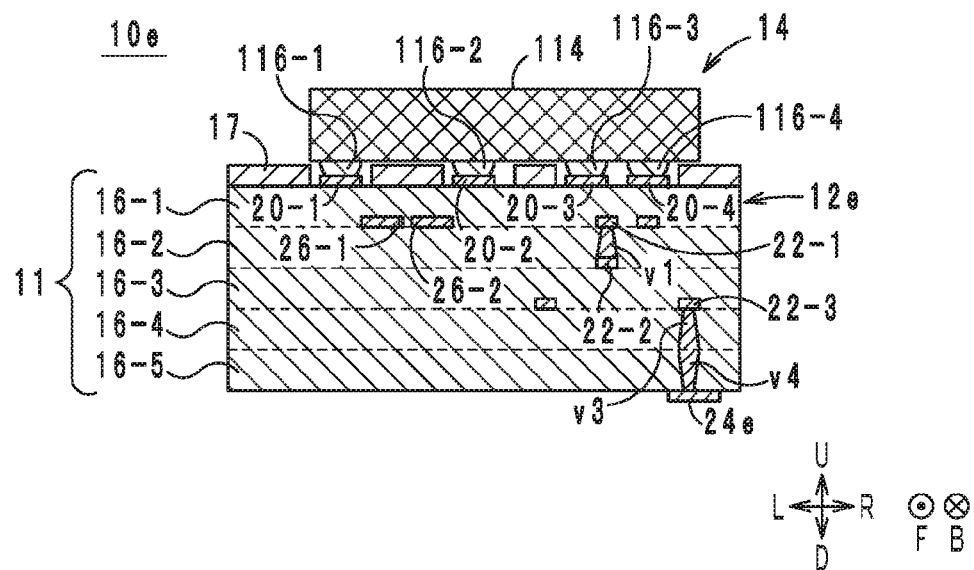
FIG. 18 is a sectional view of a component mounted board 10e according to a fifth modification of a preferred embodiment of the present invention.

Next, a multilayer substrate according to a fifth modification of a preferred embodiment of the present invention will be described with reference to the drawings. FIG. 18 is a sectional view of a component mounted board 10e according to the fifth modification.

The multilayer substrate 12e according to the fifth modification differs from the multilayer substrate 12d in the location of the dummy thin conductor 26-2. In the multilayer substrate 12e, the dummy thin conductor 26-2 (an example of the second dummy conductor) does not overlap the dummy thin conductor 26-1 (an example of the first dummy conductor), and the dummy thin conductor 26-2 is disposed on the insulating sheet 16-1 where the dummy thin conductor 26-1 is disposed. The dummy thin conductor 26-1 and the dummy thin conductor 26-2 do not need to overlap each other when viewed from above.

Figure 19:
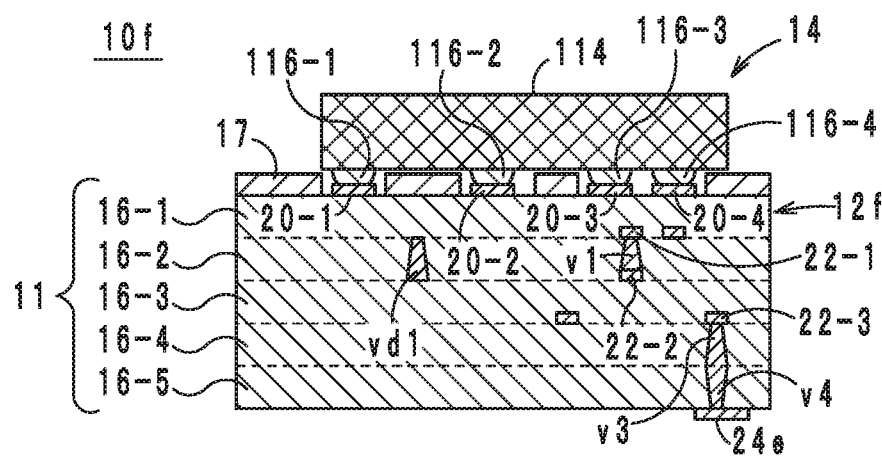
FIG. 19 is a sectional view of a component mounted board 10f according to a sixth modification of a preferred embodiment of the present invention.

Next, a multilayer substrate according to a sixth modification of a preferred embodiment of the present invention will be described with reference to the drawings. FIG. 19 is a sectional view of a component mounted board 10f according to a sixth modification.

The multilayer substrate 12f according to the sixth modification differs from the multilayer substrate 23 in that the multilayer substrate 12f includes not the dummy thin conductors 26-1 and 26-2 but a dummy via-hole conductor vd1 (an example of the first dummy conductor and an example of a first dummy via-hole conductor). In the multilayer substrate 12f, the dummy via-hole conductor vd1 pierces through the insulating sheet 16-2 in the up-down direction. The dummy via-hole conductor vd1 is not connected to any other conductors and accordingly is in a floating state. The dummy via-hole conductor vd1 can be formed in the same step as the step of forming the other via-hole conductors v1 to v4 (examples of a second via-hole conductor), and therefore, it is preferred that the dummy via-hole conductor vd1 is made of the same material as the other via-hole conductors v1 to v4.

The multilayer substrate 12f and the component mounted board 10f configured as described above have the same advantageous effects as the multilayer substrate 12 and the component mounted board 10.

Next, a multilayer substrate according to a seventh modification of a preferred embodiment of the present invention will be described with reference to the drawings. FIG. 20 is a sectional view of a component mounted board 10g according to a seventh modification.

The multilayer substrate 12g according to the seventh modification differs from the multilayer substrate 12a in that the multilayer substrate 12g further includes dummy via-hole conductors vd2 to vd4 (examples of the dummy via-hole conductor). The dummy via-hole conductors vd2 to vd4 pierce through the insulating sheet 16-2 in the up-down direction. The dummy via-hole conductor vd2 connects the dummy thin conductor 32-1 and the dummy thin conductor 32-2. The dummy thin conductors 32-1 and 32-2, and the dummy via-hole conductors vd2 are not connected to any other conductors, and accordingly are in a floating state. The dummy via-hole conductor vd3 connects the dummy thin conductor 26-1 and the dummy thin conductor 26-2. The dummy thin conductors 26-1 and 26-2, and the dummy via-hole conductors vd3 are not connected to any other conductors, and accordingly are in a floating state. The dummy via-hole conductor vd4 connects the dummy thin conductor 36-1 and the dummy thin conductor 36-2. The dummy thin conductors 36-1 and 36-2, and the dummy via-hole conductors vd4 are not connected to any other conductors, and accordingly are in a floating state.

The multilayer substrate 12g and the component mounted board 10g configured as described above have the same advantageous effects as the multilayer substrate 12a and the component mounted board 10a.

In the multilayer substrate 12g and the component mounted board 10g, the dummy thin conductor 32-1 and the dummy thin conductor 32-2 are connected by the dummy via-hole conductor vd2. This prevents the dummy thin conductors 32-1 and 32-2 from being displaced in the front-back direction and the right-left direction. The same is true of the dummy thin conductors 26-1, 26-2, 36-1 and 36-2.

Figure 21:
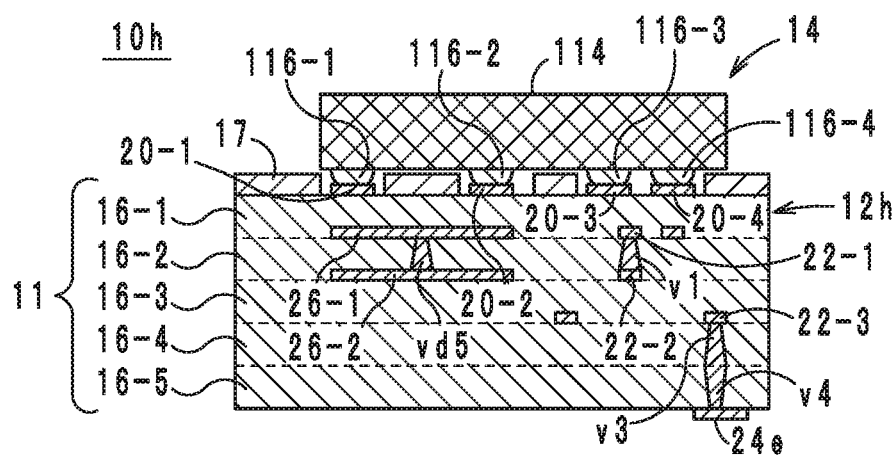
FIG. 21 is a sectional view of a component mounted board 10h according to an eighth modification of a preferred embodiment of the present invention.

Next, a multilayer substrate according to an eighth modification of a preferred embodiment of the present invention will be described with reference to the drawings. FIG. 21 is a sectional view of a component mounted board 10h according to the eighth modification.

The multilayer substrate 12h according to the eighth modification differs from the multilayer substrate 12 in that the dummy thin conductors 26-1 and 26-2 of the multilayer substrate 12h have greater size and in that the multilayer substrate 12h further includes a dummy via-hole conductor vd5. When the multilayer substrate 12h is viewed from above, the dummy thin conductors 26-1 and 26-2 overlap the external electrodes 20-1 and 20-2, respectively.

The dummy via-hole conductor vd5 pierces through the insulating sheet 16-2 in the up-down direction, and does not overlap the external electrodes 20-1 and 20-2 when viewed from above. The dummy via-hole conductor vd5 connects the dummy thin conductor 26-1 and the dummy thin conductor 26-2. The dummy thin conductors 26-1 and 26-2, and the dummy via-hole conductor vd5 are not connected to any other conductors, and are in a floating state.

The multilayer substrate 12h and the component mounted board 10h have the same advantageous effects as the multilayer substrate 12 and the component mounted board 10.

In the multilayer substrate 12h and the component mounted board 10h, the dummy via-hole conductor vd5 does not overlap the external electrodes 20-1 and 20-2 when viewed from above. This prevents the top surface and the bottom surface of the multilayer substrate 12h from bulging outward at the positions just over and just under the dummy via-hole conductor vd5. This prevents lowering of the flatness of the top surface and the bottom surface.

Multilayer substrates, component mounted boards and production methods of component mounted boards according to various preferred embodiments of the present invention are not limited to the multilayer substrates 12 and 12a to 12h, the component mounted boards 10 and 10a to 10h and the production methods of the component mounted boards 10 and 10a to 10h, and it is possible to modify these in various ways without departing from the scope of the present invention.

The elements of the multilayer substrates 12 and 12a to 12h, the elements of the component mounted boards 10 and 10a to 10h and the elements of the production methods of the component mounted boards 10 and 10a to 10h may be combined arbitrarily.

In the above-described preferred embodiments and modifications, the dummy thin conductors preferably are located in the areas A1 and A6 when viewed from above. However, the dummy thin conductors may be disposed in all of the areas A1, A2, A6 and A7. In other words, the dummy thin conductors need to be disposed in at least one of the areas A1, A2, A6 and A7 that have radii of D1, D2, D6 and D7 that are greater than the average Dave. It is preferred that a dummy thin conductor is disposed preferentially in an area having a greater radius.

The dummy thin conductors 26-1, 26-2, 28-1, 28-2, 30-1, 30-2, 32-1, 32-2, 34-1, 34-2, 36-1, 36-2, 40-1, 40-2, 42-1, 42-2, 44-1, 44-2, 46-1 and 46-2 may be made of any material other than metal, such as resin. It is preferred that the material of the dummy thin conductors 26-1, 26-2, 28-1, 28-2, 30-1, 30-2, 32-1, 32-2, 34-1, 34-2, 36-1, 36-2, 40-1, 40-2, 42-1, 42-2, 44-1, 44-2, 46-1 and 46-2 is the same as the material of the wiring thin conductors 22-1 to 22-3. It is also preferred that the material of the dummy thin conductors 26-1, 26-2, 28-1, 28-2, 30-1, 30-2, 32-1, 32-2, 34-1, 34-2, 36-1, 36-2, 40-1, 40-2, 42-1, 42-2, 44-1, 44-2, 46-1 and 46-2 is harder than the material of the insulating sheets 16-1 to 16-5. Here, the word "harder" means having a greater Young's modulus.

In the above-described preferred embodiments and modifications, the external electrodes 20-1 to 20-14 are arranged along the outer edge of the area A0. However, the external electrodes 20-1 to 20-14 may be located near the center of the area A0 rather than near the outer edge of the area A0.

Preferred embodiments of the present invention are effectively applicable to multilayer substrates, component mounted boards and methods for producing component mounted boards, and are useful in mounting a component to a multilayer substrate more securely.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
   a flexible element assembly including a principal surface;
   first to n-th external electrodes disposed on the principal surface and capable of mounting a component, where n is an integer not less than 3; and
   at least one first dummy conductor disposed inside the element assembly in a floating state; wherein
   when the element assembly is viewed from a normal direction that is normal to the principal surface, a distance between an m-th external electrode and a nearest external electrode therefrom among the first to n-th external electrodes is defined as a distance Dm, where m is an integer not less than 1 and not more than n;
   an average of distances D1 to Dn is defined as an average Dave;
   when the element assembly is viewed from the normal direction, an area within a circle having a center on the m-th external electrode and having a radius of Dm is defined as an area Am; and
   the first dummy conductor is located in at least one area Am having the radius of Dm greater than the average Dave when viewed from the normal direction.

2. The multilayer substrate according to claim 1, wherein the first dummy conductor is located in the area Am having a greatest radius of Dm.

3. The multilayer substrate according to claim 1, wherein the first dummy conductor overlaps the m-th external electrode corresponding to the area Am having the radius of Dm greater than the average Dave when viewed from the normal direction.

4. The multilayer substrate according to claim 3, wherein two or more first dummy conductors overlap the m-th external electrode corresponding to the area Am having the radius of Dm greater than the average Dave when viewed from the normal direction.

5. The multilayer substrate according to claim 1, wherein:
   the element assembly includes a plurality of insulating layers stacked in the normal direction;
   the multilayer substrate further comprises a second dummy conductor located in the area Am having the radius of Dm greater than the average Dave and not overlapping the first dummy conductor when viewed from the normal direction; and
   the first dummy conductor is disposed on one of the insulating layers, and the second dummy conductor is disposed on another of the insulating layers.

6. The multilayer substrate according to claim 1, wherein the element assembly includes a plurality of insulating layers stacked in the normal direction;
   the multilayer substrate further comprises a second dummy conductor located in the area Am having the radius of Dm greater than the average Dave and overlapping the first dummy conductor when viewed from the normal direction;
   the first dummy conductor is disposed on one of the insulating layers, and the second dummy conductor is disposed on another of the insulating layers; and
   the multilayer substrate further comprises a dummy via-hole conductor piercing through at least one of the insulating layers in the normal direction to connect the first dummy conductor to the second dummy conductor.

7. The multilayer substrate according to claim 1, wherein the element assembly includes a plurality of insulating layers stacked in the normal direction;

the multilayer substrate further comprises a second dummy conductor located in the area Am having the radius of Dm greater than the average Dave and not overlapping the first dummy conductor when viewed from the normal direction; and the first dummy conductor and the second dummy conductor are disposed on one of the insulating layers.

8. The multilayer substrate according to claim 1, wherein the first dummy conductor is a first thin conductor.

9. The multilayer substrate according to claim 1, wherein the first dummy conductor is a first thin conductor.

10. The multilayer substrate according to claim 9, further comprising:

second thin conductors disposed inside the element assembly; and a second via-hole conductor connected to the second thin conductors; wherein the first via-hole conductor and the second via-hole conductor are made of a same material.

11. The multilayer substrate according to claim 8, further comprising;

second thin conductors disposed inside the element assembly; wherein the first thin conductor and the second thin conductors are made of a same material.

12. A component mounted board comprising:

the multilayer substrate according to claim 1; and the component including first to the n-th bumps and mounted on the principal surface of the multilayer substrate, where n is an integer not less than 3; wherein the first to n-th external electrodes are ultrasonically bonded to the first to n-th bumps, respectively.

13. The component mounted board according to claim 12, wherein the first dummy conductor is located in the area Am having a greatest radius of Dm.

14. The component mounted board according to claim 12, wherein the first dummy conductor overlaps the m-th external electrode corresponding to the area Am having the radius of Dm greater than the average Dave when viewed from the normal direction.

15. The component mounted board according to claim 14, wherein two or more first dummy conductors overlap the m-th external electrode corresponding to the area Am having the radius of Dm greater than the average Dave when viewed from the normal direction.

16. The component mounted board according to claim 12, wherein:

the element assembly includes a plurality of insulating layers stacked in the normal direction;

the multilayer substrate further comprises a second dummy conductor located in the area Am having the radius of Dm greater than the average Dave and not overlapping the first dummy conductor when viewed from the normal direction; and the first dummy conductor is disposed on one of the insulating layers, and the second dummy conductor is disposed on another of the insulating layers.

17. The component mounted board according to claim 6, wherein the element assembly includes a plurality of insulating layers stacked in the normal direction;

the multilayer substrate further comprises a second dummy conductor located in the area Am having the radius of Dm greater than the average Dave and overlapping the first dummy conductor when viewed from the normal direction;

the first dummy conductor is disposed on one of the insulating layers, and the second dummy conductor is disposed on another of the insulating layers; and the multilayer substrate further comprises a dummy via-hole conductor piercing through at least one of the insulating layers in the normal direction to connect the first dummy conductor to the second dummy conductor.

18. The component mounted board according to claim 12, wherein the element assembly includes a plurality of insulating layers stacked in the normal direction;

the multilayer substrate further comprises a second dummy conductor located in the area Am having the radius of Dm greater than the average Dave and not overlapping the first dummy conductor when viewed from the normal direction; and the first dummy conductor and the second dummy conductor are disposed on one of the insulating layers.

19. The component mounted board according to claim 12, wherein the first dummy conductor includes a first via-hole conductor.

* * * * *

UNITED STATES PATENT AND TRADEMARK OFFICE
CERTIFICATE OF CORRECTION

PATENT NO. : 9,972,567 B2
APPLICATION NO. : 15/616996
DATED : May 15, 2018
INVENTOR(S) : Kuniaki Yosui et al.

Page 1 of 1

It is certified that error appears in the above-identified patent and that said Letters Patent is hereby corrected as shown below:

In the Claims

Claim 17, Column 18, Line 15 should be corrected as follows:
--The component mounted board according to claim 12...--

Signed and Sealed this
Twenty-eighth Day of May, 2019

Andrei Iancu
*Director of the United States Patent and Trademark Office*